BAND-PASS AMPLIFIER WITH FEEDBACK CIRCUITRY
Filed Feb. 6, 1962
3 Sheets-Sheet 1
FIG. I.
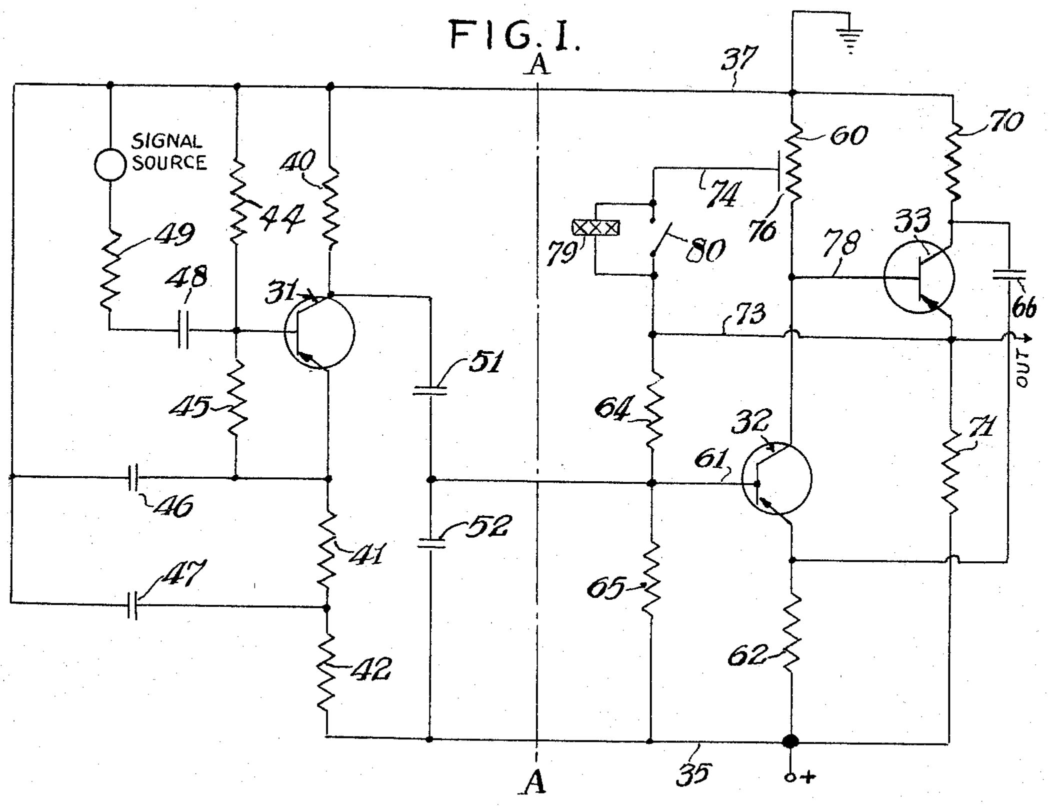
FIG. III.
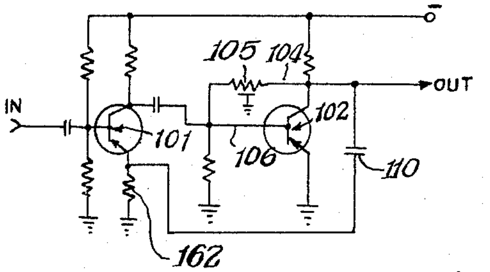
FIG. IV.
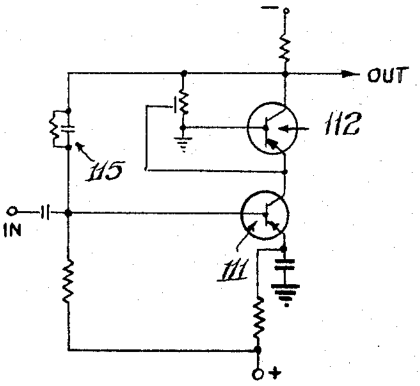
FIG. VI
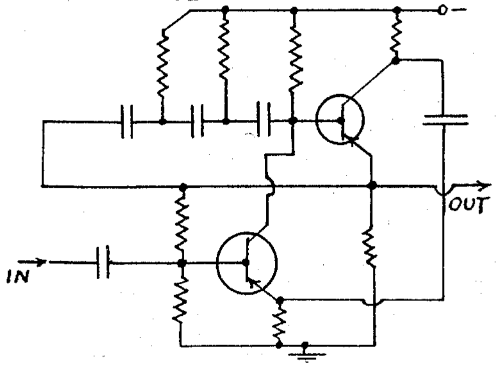
INVENTOR
Manfred Kahn
BY Connolly and Hutz
ATTORNEYS FIG. II.
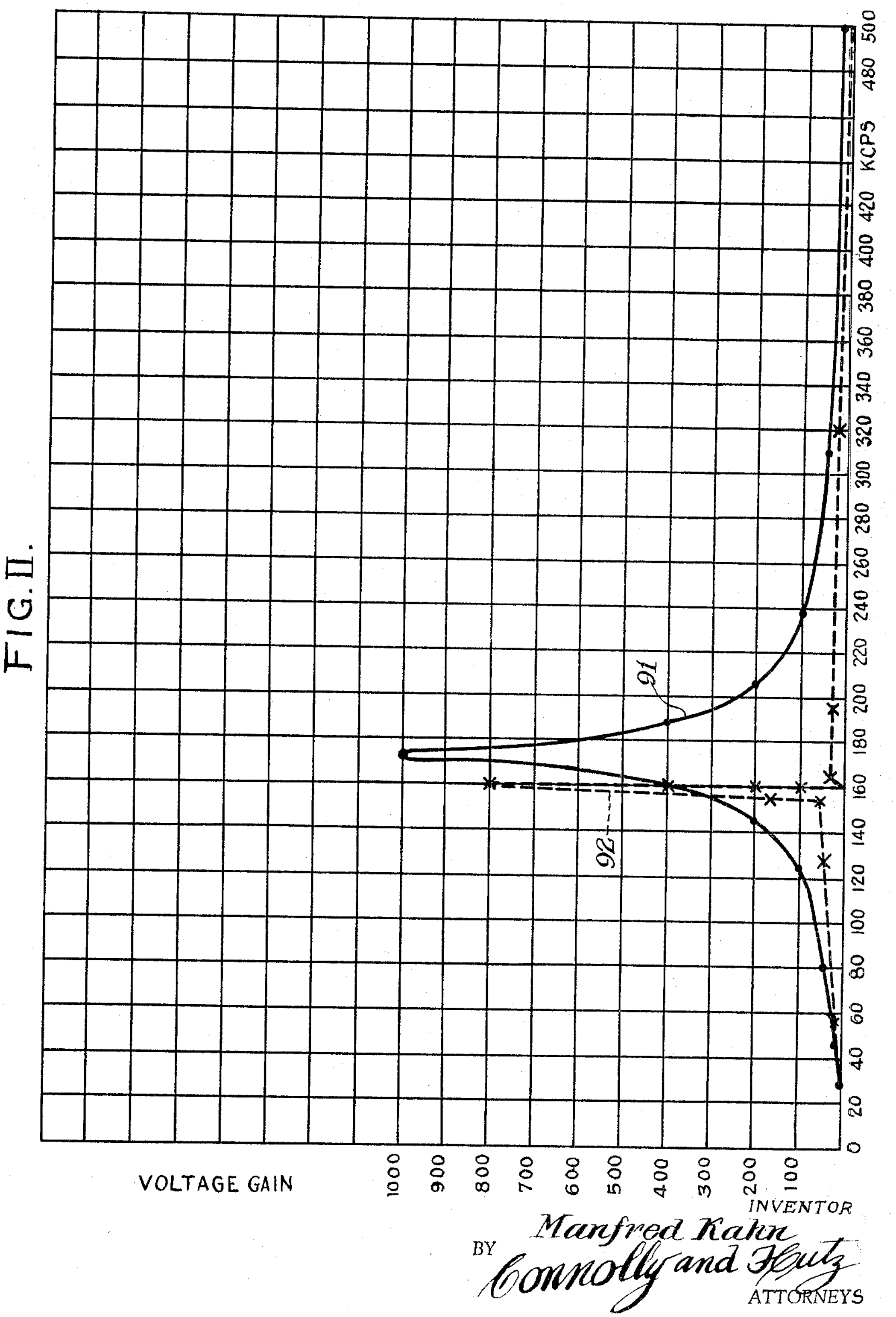
INVENTOR
Manfred Kahn
BY Connolly and Hutz
ATTORNEYS FIG. VIII
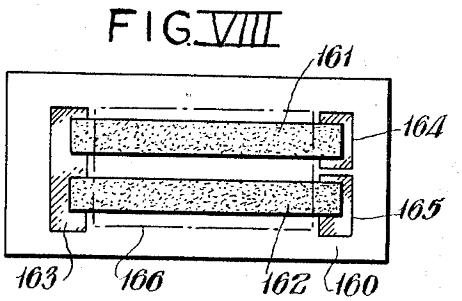
FIG. IX
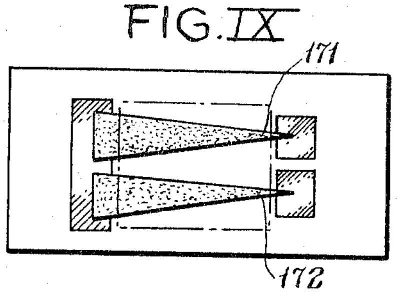
FIG. X
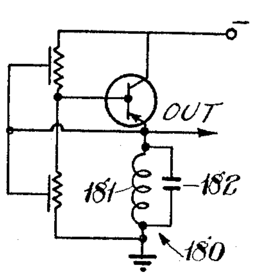
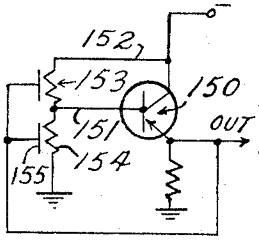
FIG. VII
FIG. XI
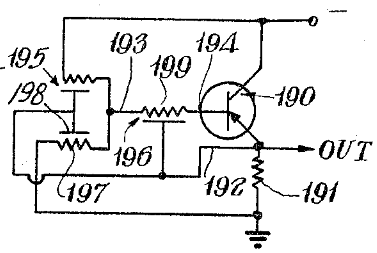
FIG. XIII, FIG. XII
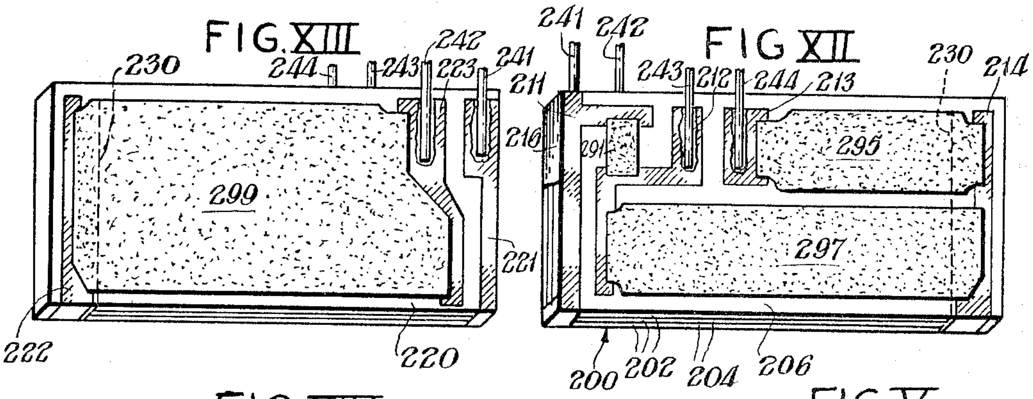
FIG. XIV
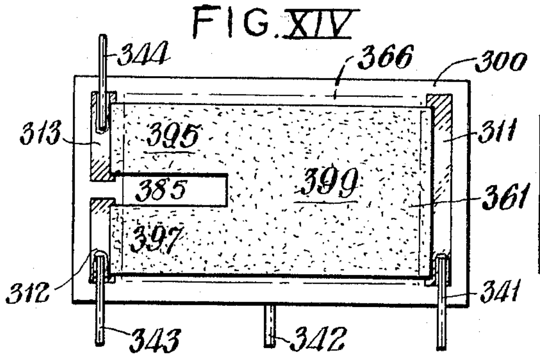
FIG. V
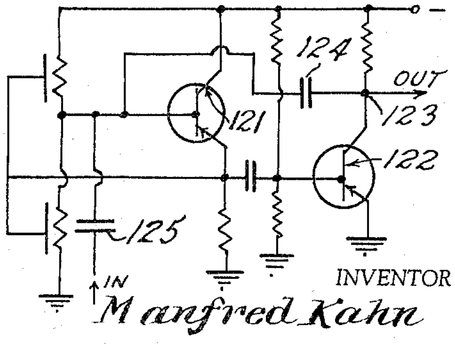
INVENTOR
Manfred Kahn
BY Connolly and Hutz
ATTORNEYS 3,284,719

BAND-PASS AMPLIFIER WITH FEEDBACK CIRCUITRY

Manfred Kahn, Williamstown, Mass., assignor to Sprague Electric Company, North Adams, Mass., a corporation of Massachusetts Filed Feb. 6, 1962, Ser. No. 171,495
10 Claims. (Cl. 330—26)

The present invention relates to electronic circuits that can be used for amplifying electrical signals.

Among the objects of the present invention is the provision of novel circuits of the above type.

The above as well as further objects of the present invention will be more readily understood from the following description of several exemplifications thereof, reference being made of the accompanying drawings wherein:

FIG. I is a schematic diagram of one form of amplifier exemplifying the present invention and including a regenerative section;

FIG. II is a curve diagram showing typical results obtained by the amplifier of FIG. I;

FIG. III is a schematic diagram of another form of amplifier embodying the present invention;

FIGS. IV, V and VI are schematic diagrams of still further modifications of amplifiers in accordance with the present invention;

FIG. VII is a schematic diagram of an oscillator circuit suitable for use in the frequency response determining section of the above amplifiers;

FIG. VIII is a plan view of the structure of a component that can be used in the circuit of FIG. VII;

FIG. IX is a plan view of a modified form of the component of FIG. VIII;

FIGS. X and XI are schematic diagrams of still further types of oscillator circuits representative of the present invention;

FIG. XII is a partly broken away isometric view from above of the structure of a component suitable for use in the oscillator of FIG. XI;

FIG. XIII is an isometric view from the bottom of the component of FIG. XII; and FIG. XIV is a plan view of another form of component that can be used in the oscillator of FIG. XI.

Desirable multi-stage amplifiers have been indicated to be feasible in the art by having positive feedback around the individual amplifier stages and a common negative feedback loop around the whole amplifier. According to the present invention an amplifier is provided consisting of at least two stages. One stage is regenerative since it incorporates positive feedback and the other stage is a straight forward amplifier. Negative feedback around the two stages suppresses oscillation and causes the regenerative stage to behave as a negative impedance at the frequency of the free running oscillation. Because of this negative impedance, such an amplifier has a fairly narrow band-pass characteristic and this band-pass can be provided without the use of any inductors.

While advantages are obtained when the regenerative stage is connected to the input of the straight amplifier stage, better results are obtained when it is connected as a load to the output of amplifying stage.

A particularly simple and highly desirable form of regenerative circuit for use in connection with the above amplifier or for independent use, is one that is in the form of a common-collector transistor amplifier, with a distributed feedback network connected from the emitter to the base. This network includes a resistance as well as a distributed capacitance which together provide a frequency region where the transfer characteristics of the feedback network has a voltage gain in excess of one. Such a distributed network is described in commonly assigned copending application Serial No. 656,533, filed May 2, 1957, (now U.S. Patent 3,109,983 granted November 5, 1963) and can be used in unchanged form for the purposes of the present invention.

It is helpful in such transistor oscillators to fix the D.C. voltage at the base terminal of the transistor by connecting a suitable resistance between the base and the ground terminal. The use of such a base return resistance can be further improved by placing it in distributed capacitive relation with the feedback capacitance. This eliminates the A.C. losses that would otherwise take place through the base to ground resistance.

Whether or not a base to ground resistance is used, the feedback capacitance connection can, if desired, be provided with a frequency-controlling member, such as a high Q resonant device or circuit. Piezoelectric ceramics have been found particularly desirable for this purpose although quartz crystals and other piezoelectric or electromechanical resonant members or circuits will also operate successfully.

In order to provide oscillator circuits of predetermined exact characteristics, i.e., to provide signals having a specific frequency, it is usually necessary to vary the circuit components to compensate for the normal variations of the amplification upon which the oscillation depends. Transistors obtained from a production line are generally sufficiently varying in individual characteristics that they will not produce oscillations within about 15% of a preset value unless the components combined with it in the oscillator circuit are suitably controlled. One very practical arrangement of this type in accordance with the present invention, has a feedback network of the above type connected between the transistor's emitter and the transistor's base in the above manner, but divided into three parts connected together in the fashion of a Y. One leg of the distributed network connects to the base of the transistor, one to the power supply, and one to the ground terminal; and each of the legs has a distributed capacitance that is connected to the emitter terminal. In such a construction the resistance in the leg which is directly connected to the base is constructed in a form, such as a painted layer, that can be adjusted, as by scraping off portions of the layer, and such adjustment will vary the output frequency of the oscillator, without significantly changing the D.C. voltage at the base. The other two legs of the Y comprise a voltage divider to set the D.C. voltage at the base. The fact that they also have distributed capacitance to the emitter avoids the necessity of utilizing a separate high value by-pass capacitor from the junction point to the ground terminals.

Referring now to the details of the drawings, the amplifier of FIG. I has three transistor stages 31, 32 and 33, all connected in series and all energized by D.C. current impressed between a positive bus 35 and a ground return 37. Stage 31 is operated as a common emitter buffer amplifier with a collector resistor 40, a pair of series-connected emitter decoupling resistors 41 and 42, and a pair of series-connected D.C. voltage-setting resistors 44 and 45 connected between the ground return and the base, and between the base and the emitter, respectively. Each of the emitter resistors is by-passed for the frequencies to be amplified by a capacitance 46, 47 and the signal is supplied to the base through a capacitor 48 from the signal source shown that has an internal resistance symbolized by series resistor 49. The function of this stage is to give additional gain, to reduce the dependency of the amplifier performance upon the source impedance, and to supply some insertion loss at very low frequencies.

The amplified output of stage 31 is delivered from its collector terminal through coupling capacitor 51 to the base terminal 61 of stage 32. Stage 32 is also connected as a common-emitter amplifier with a small emitter resistor 62, base D.C. voltage-setting resistors 64 and 65, and a collector load that is made up of stage 33 and its feedback network 60 and 76. Base voltage-setting resistor 65 is connected between the D.C. bus 35 and the base, and its companion resistor 64 is connected between the base and the emitter of stage 33. Resistor 64 can also be connected from the base to the ground return or any other suitable source of direct current. By connecting resistor 64 to the emitter of stage 33 improved stabilization is achieved by virtue of negative D.C. feedback supplied from this terminal. If desired, the coupling between stages 31 and 32 can be used to suppress extraneous signals. This is achieved by selecting a value of coupling capacitor 51 so that along with the base resistors 64 and 65 and the input impedance of stage 32, signals of excessively low frequency will not be transmitted very effectively to stage 32. Similarly, a by-pass capacitor 52 can be connected across base resistor 65 to attenuate signals of excessively high frequency. This capacitor 52 also serves to increase the output impedance of stage 32 so as to not unduly load the positive feedback network that feeds the base of stage 33.

Stage 33 is operated as an emitter-follower with a large emitter resistor 71, a small collector resistor 70 and a positive feedback loop from the emitter through leads 73 and 74 to a distributed capacitance 76 as well as through resistor 60 to lead 78 connected to the base of stage 33. Between leads 73 and 74 there is shown a piezoelectric ceramic disc 79 by-passed by a switch 80 so that the piezoelectric ceramic can be used to control the feedback frequency, or it can be short-circuited, as desired. This symbolizes two possible independent modes of operation of the amplifier.

The distributed capacitance 76 is very effectively provided by a resistance-capacitance network that includes resistor 60 and has this resistor in two dimensional form with a capacitor electrode extending coplanar with the resistor in capacitive relation with it. This is more fully described in the above-mentioned copending patent application Serial No. 656,533, and such a combination has signal-transfer characteristics that provide a voltage gain of greater than one for signals having certain frequencies at very small phase shifts.

As shown in FIG. 16 of the above copending application, such gain is obtained when the $\omega RC$ equals about 10 or thereabouts. Where R is the distributed resistance, C is the distributed capacitance, and $\omega$ is $2\pi$ times the frequency of the signal. Indeed, the voltage gain will even be above 1.1 for such signals. Because of this gain in the feedback loop, the stage 33 is operated in a regenerative mode notwithstanding the fact that it is of the emitter-follower type. Emitter-follower stages have voltage gains that are somewhat lower than one, so that without the gain due to the feedback loop, stage 33 will not oscillate.

In order to construct the stable frequency-selective amplifier, a negative feedback loop is required around stages 32 and 33. Resistors 62 and 70 and capacitor 66 fulfill this function.

The effect of the two feedback loops is to increase by 20 db or more the gain of stage 32 in the regeneration frequency range as against some widely different frequency, such as 1/10 of that frequency. This additional gain is caused by the negative impedance which the regenerative stage 33 introduces into the effective circuit for stage 32. Stage 31 is not appreciably affected by the feedback actions and can in fact be omitted where no buffering is needed, as for example where any earlier amplification is already buffered or where the signal supply will not be affected by the absence of buffering. A two-stage amplifier as is apparent on the right of the dotted line A—A in FIGURE I will then have a gain of about 40 db and a bandpass characteristic similar to what is shown in FIGURE II.

By reason of the above operation the amplifiers of the present invention give good band-pass characteristics without any inductors. This is a very significant advantage in both low frequency applications and in cases where microminiaturization of any degree is required. The components used herein are all adaptable to integrated circuit techniques, which are not suitable for manufacture of inductive elements. FIG. II shows two different types of operating results obtained with the circuit of FIG. I using the following circuit constants:

| | |
|---|---|
| Transistors | All type 2N412. |
| D.C. supply voltage | 9 volts. |
| Resistor 44 | 39,000 ohms. |
| Resistor 45 | 4,700 ohms. |
| Resistor 40 | 1,000 ohms. |
| Resistor 41 | 5,000 ohms. |
| Resistor 42 | 5,000 ohms. |
| Capacitor 46 | 5,000 micromicrofarads. |
| Capacitor 47 | 5,000 micromicrofarads. |
| Capacitor 51 | 1,000 micromicrofarads. |
| Capacitor 52 | 500 micromicrofarads. |
| Resistor 64 | 68,000 ohms. |
| Resistor 65 | 4,700 ohms. |
| Resistor 62 | 47 ohms. |
| Resistor 60 | 1,800 ohms. |
| Resistor 70 | 100 ohms. |
| Resistor 71 | 2,200 ohms. |
| Capacitor 66 | 1,500 micromicrofarads. |
| Capacitance 76 | 7,500 micromicrofarads. |
| Piezo ceramic 79 | Barium titanate disc 1.585 mm. thick and 19.05 mm. in diameter resonating by itself at 160 kilocycles per second. |

Curve 91 in FIG. II represents the band-pass gain characteristic with the piezoelectric ceramic 79 short-circuited, and curve 92 with this ceramic not short-circuited.

FIGURE III shows a different amplification system that behaves like the two-stage section of FIG. I. The circuit of FIG. III has two stages 101 and 102; the first, 101, being connected as a common emitter transistor amplifier RC coupled to stage 102 which operates as a grounded-emitter regenerative stage. The positive feedback loop of stage 102 is from its collector through lead 104, resistor 105, lead 106 to the base of the transistor, and in addition the resistor 105 has a distributed capacitance connection to the grounded emitter of the same transistor. Such a feedback network provides regeneration at the frequency at which its output is 180° out of phase with respect to its input. This compensates for the 180° phase shift produced by the transistor of stage 102 operating in a grounded emitter mode. When a negative feedback loop that is made up of capacitor 110 and resistor 162 is connected around both stages of this amplifier, band-pass amplification similar to FIG. II is obtained. It will be noticed that in the output stage of FIG. III there is no emitter resistor. A larger proportion of the supply voltage can therefore be applied across the transistor and the collector resistor, respectively. This allows a somewhat larger maximum output voltage. Like the circuit of FIG. I, that of FIG. III has no inductors.

FIGURE IV shows a further form of amplifier in accordance with the present invention, having a first transistor amplifier stage 111, and a second transistor amplifier stage 112 which has regenerative feedback. Stage 111 is operated with a grounded emitter, and stage 112 as a grounded base amplifier, with the transistor of stage 111 supplying the emitter current for stage 112. The feedback network for stage 112 is the same as the feedback network in FIG. III except for the shifting of the ground connection. The regenerative stage in the circuit of FIG. IV has an effect on the amplification similar to that in FIGS. I and III. The degenerative feedback network 115 is also shown in this construction. This circuit utilizes only relatively few components and no inductors, and is therefore most suitable for applications where microminiaturization is required.

The circuit of FIG. V shows a further modification of the invention in which a two stage amplifier has the regenerative feedback in the first stage 121, with a second stage 122 from which negative feedback is taken at 123. Section 121 is operated as an emitter-follower amplifier with a positive feedback network similar to that in the circuit of FIG. I. Stage 122 is operated as a grounded-emitter amplifier and the amplified signal is taken from its collector terminal. Capacitor 124 serves the purpose of providing the degenerative feedback from the output to the input which is here shown as the base connection of stage 121. Again the negative feedback is necessary to provide stabilization to the amplifier.

The circuit of FIG. V also gives band-pass amplification effects as in the circuits described above, notwithstanding the fact that regenerative stage 121 does not operate as a negative impedance load on the amplification stage 122. Instead the negative impedance of this stage operates on the input coupling capacitor 125 and on the source impedance.

FIGURE VI is a two-stage transistor amplification system corresponding to the two-stages 32 and 33 of FIG. I, but with the resistance-distributed-capacitance feedback network of FIG. I replaced by a lumped resistance-capacitance network in FIG. VI. The operation is similar, but the number of components is increased.

For convenience of description this invention is described in terms of a single positive feedback loop and a single negative feedback loop. However, even higher amplification has been obtained by employing a number of positive and negative loops around a multitude of stages. Any number of loops and stages may be employed, provided that each negative feedback loop extends over at least one more amplifying stage than the positive feedback loops it is to stabilize.

The regenerative stages described above in connection with the amplification systems are also suitable for use by themselves as oscillators wherever a source of alternating current signals is needed.

FIGURE VII illustrates a stabilized version of an oscillator circuit corresponding to the positive feedback circuit of FIG. V. It has the form of an emitter-follower transistor amplifier stage 150 having a feedback loop including leads 151 and 152, and a resistance-distributed-capacitance network 153. This network is connected between the emitter and the base of the transistor as in the circuits of FIGS. I, IV, and V. A resistor 154 connected between the base and the ground return completes a D.C. voltage-dividing circuit that establishes a D.C. operating voltage for the transistor's base. Resistor 154 has the disadvantage of drawing signal current from network 153 to ground, thereby reducing the loop gain. To eliminate this effect, resistor 154 is made elongated and in distributed-capacitance relation 155 with the emitter, in a manner similar to the resistance in feedback network 153. As a result, there is no signal loss because the combination of resistor 154 and its distributed-capacitance 155 acts as a duplicate parallel-connected feedback network corresponding to network 153, so that feedback signals are actually supplied through resistor 154 from the emitter to the base. This signal supply current is in a direction opposite to the direction of signal loss current which would exist if resistor 154 would not have distributed-capacitance connected to the emitter terminal. The two parallel connected feedback networks behave similar to a single network in the same configuration. The RC product of the parallel combination is the same as what would be calculated from paralleling the resistances and from paralleling the capacitances of the two networks.

Because of the similarity between the feedback network 153 and the resistance-distributed-capacitance network 154 in the base-to-ground circuit, these two networks are conveniently provided as a single printed-circuit type assembly. FIG. VIII shows such an assembly in which a self-supporting dielectric sheet 160 carries on one of its faces a pair of resistor coatings 161 and 162. These coatings, which can be of the conventional bonded carbon type as described for example in the National Bureau of Standards Circular 468 issued November 15, 1947, or of an inorganic resistive material. Coatings 161 and 162 are provided with terminals 163, 164, 165 to which leads can be easily connected as by soldering, also as described in the above Circular 468. In or on the opposing face of the dielectric sheet there is a conductive layer 166 directly facing the resistive layers 161 and 162 which is also provided with a terminal lead. The leads secured to the four conductive layers 163, 164, 165, and 166 can then be connected to the base, power supply, ground, and the emitter, respectively, in accordance with FIG. VII.

The resistive layers 161 and 162 can be placed very close together since at each corresponding point along the length of the two resistors there is the same A.C. potential present, and any edge capacitance between the two resistive layers resulting from the extreme proximity, will not affect the operation of the assembly. Accordingly, while the resistive layers can be applied as separate printed units, they can also be applied in the form of a single layer which after application is longitudinally cut by removing a very narrow intervening width. The same cut can be used to sever a single terminal coating into the two coatings 164 and 165. The resistances of the two layers 161 and 162 need no be identical, but if not, the layers will have to have appropriately different widths and/or lengths to retain the same $R/C$ ratio.

The capacitative conductive layer 166 can be in direct opposition not only with the resistors but also with the boundary of the terminal layers 163, 164, and 165. Some additional stray capacitance which is thereby introduced in the circuit will have no deleterious effect on circuit performances, except that it will change somewhat the frequencies of operation.

FIGURE IX shows a modified form of resistance-distributed-capacitance assembly which is similar to that of FIG. VIII except that in FIG. IX the resistive layers 171 and 172 are made of tapered width to take advantage of the impedance conversion afforded by a tapered network. This results in a lower ratio of driving-point impedance to load-impedance both at the emitter and the base, and thereby increases the loop voltage gain and regeneration.

The positive feedback network of FIG. I can have a phase shift between 0 and 15° and still have a voltage gain that exceeds one. The loaded transistor used as an oscillator therefore can have the same amount of phase shift with the opposite sign and the circuit still will oscillate. Examination of the voltage-transfer characteristic of the network shows that an increased phase shift will reduce the frequency of the positive feedback and at the same time increase the loop gain somewhat. This results in an output signal that is constant or increases slightly when a load is connected to the oscillator. As a result the load can be made to have a decisive influence on the frequency of oscillation. This works two ways: first, by varying the phase shift of the load one can change the frequency of oscillation; second, loads of different magnitudes can be added or subtracted at the output lead without changing the frequency of operation as long as the phase shift of the load impedance is constant. The last-mentioned feature has been found very useful in applications where close frequency control under varying load conditions is required. This has been realized by placing a suitable capacitor across each resistive load.

A variable impedance across the output terminals of the amplifiers of the present invention can also be used to ajust the center frequency of the pass band. Adjustment of its center frequency can also be obtained by applying a D.C. voltage to the distributed capacitance of the RC feedback network. This D.C. voltage will change the distributed capacitance and hence the frequency response.

It has further been found that an oscillator utilizing this configuration is very efficient for two reasons: (1) it provides a high output power because an emitter-follower has a low output impedance and because almost the full supply voltage is available for peak to peak output swing; (2) it has also been found that the circuit will oscillate with transistors that have relatively low gains. Transistors with grounded emitter current gain (Beta) as low as 17 have shown to give oscillation.

It has further been discovered that the transfer characteristics of the distributed feedback network will show a voltage gain of more than one at another range of frequencies, where the $\omega RC$ values are about twenty times those for the above-mentioned peak. The gain at the higher frequency range has an appreciably smaller peak than at the lower frequency range but the positive feedback can be made regenerative at the higher frequency and will provide similar oscillatory action.

FIG. X shows such an oscillator circuit that operates in the high frequency mode by virtue of the inductor 181 that replaces the emitter resistor and by-passes any signal in the frequency range of $\omega RC=10$ radians. Capacitor 182 in conjunction with this inductor composes an anti-resonant circuit at the frequency range of $\omega RC=200$ radians where the second peak in the response curve of the distributed network occurs. Oscillation therefore results at this frequency.

FIGURE XI shows a further embodiment of an oscillator in accordance with the present invention. Here a transistor stage 190 is operated as an emitter-follower with the emitter resistor 191, and a feedback circuit that consists of three parts. They are connected between the emitter and the base by leads 192, 193, and 194. Sections 195 and 197 of the distributed-network are connected in series for D.C. from power supply to ground, and in an equivalent parallel configuration for A.C. current since there is a low A.C. impedance at the output of the power supply. This is equivalent to what was described above. In the circuit of FIG. XI, this combination is connected in series with section 199 of the distributed network. The emitter of the transistor is connected by lead 192 to the capacitance terminals of the three sections, thereby providing positive feedback to the base of the transistor. The total equivalent distributed-capacitance of the network is the sum of the three distributed capacitances. The total equivalent resistance is what would be found by adding resistances of section 199 and the resistance value obtained by calculating the equivalent parallel resistance of sections 195 and 197. This formula holds true only when the $R/C$ of all three networks are the same.

Sections 195 and 197 are made to comprise a voltage divider to set a D.C. voltage for the transistor base terminal. Section 196 is provided to make it possible to subject the network to final adjustment to set accurately the frequency of oscillation. This is done by varying the cross-section of resistor 199 to bring the frequency within specification. Resistor 199 has only little influence on the D.C. base voltage, since the base current is of very small magnitude, and thereby provides a substantially independent adjustment of the frequency.

The normal run of transistors is such that without this type of adjustment the oscillator frequency would vary by an appreciable amount, even if the remainder of the circuit was held to a high order of accuracy. However, resistor 191 as well as the resistance-capacitance networks 195, 196, and 197 are also subject to some variation. If there is no resistor 199 to adjust, as in the circuits described above, final adjustment would generally involve changing both resistors in the voltage-divider that sets the base D.C. voltage. Dual adjustments of this type are much more complicated than the simple single adjustment enabled by resistor 199. Resistor 199 can be made as a printed resistance layer exposed for convenient adjustment as by merely removing small portions of the layer. For this purpose the resistance layer can be made to provide the minimum resistance normally needed, and this resistance can be increased by the desired removal. The resistance adjustment can also be arranged to diminish the resistance as by applying another layer of resistance coating over the main layer so that the covering layer contacts the main layer at least at two longitudinally spaced portions of the main layer.

Vacuum tube type oscillators can also take advantage of these improvements mentioned.

Inductor 181 and/or capacitance 182 in FIG. X can, if desired, be also printed on the same dielectric sheet that carries the resistance-distributed-capacitance networks. Correspondingly any other circuit elements such as the emitter resistor 191 of FIG. XI can be made part of this assembly.

FIGURES XII and XIII show a practical form of printed circuit assembly that includes all the circuit elements of FIG. XI except for the transistor. This assembly is built on a base 200 having alternating dielectric strata 202 and conductive strata 204. The central dielectric stratum can be of the self-supporting type with the remaining strata applied as coatings over both of its faces, or all the strata can be made of coatings. Face 206 of this base carries a set of conductive terminal coatings 211, 212, 213, and 214. Coating 211 extends over the edge of the base shown partly broken away at 216 and onto the back face 220 (see FIG. III where it is illustrated at 221). Coating 214 similarly extends over a different edge of the base to its back face where it is shown (FIG. XIII) at 222. Both of these coatings 211 and 214 can be provided by a dipping technique.

Between conductive coatings 211 and 212 on face 206 there is applied a resistive layer 291. This fulfills the function of the emitter resistor 191 in FIG. XI. As shown here, this resistor is in a distributive-capacitance relationship to the conducting strata 204 that is connected to the transistor emitter via lead 241. This places a capacitive load on the oscillator output. This load has only a small effect on the operation of the oscillator, but should it become desirable to eliminate it, a low dielectric-constant strata can be placed under the resistor and under the leads 243 and 244 as in commonly assigned U.S. Letters Patent 2,694,185 granted November 9, 1954. Leads 243 and 244 are connected to the ground terminal and to the collector supply, respectively, and the aforementioned low dielectric-constant strata will then also reduce the stray capacitance effects from these leads to the internal electrode and thereby the emitter terminals. Another resistive layer 297 is applied on this face between conductive coatings 212 and 214, and a third resistive layer 295 between conductive coatings 213 and 214. Resistive layer 297 in conjunction with internal electrode 204 corresponds to distributed network 197–198 in FIG. XI; and resistor 295 and its distributed capacitance corresponds to the distributed network 195. On the opposite face 220 a single resistive layer 299 is connected between terminal coating 222 and an extra terminal coating 223, and corresponds to the resistive part 199 in FIG. XI. Terminal coating 211 and its associated coatings 216 and 221 are in conductive contact with the conducting strata 204 which extend to the edge carrying layer 216. The opposite terminal coatings 214 and 222 are not connected with these strata as by arranging that the strata extend only as far as the dash-line 230. If desired the conductive strata can be extended entirely across the sheet and the capacitance between terminal coatings 211 and 214 minimized, as by an intervening low dielectric constant layer under coating 214, or this capacitance-minimizing can be completely omitted. Instead of using two conductive strata 204, a single such stratum can be used.

FIGURES XII and XIII also show terminal leads 241, 242, 243, 244 for connection to the emitter base, ground, and supply voltage, respectively. The remaining conductive coating 214 corresponds to the internal lead 193 in the above circuit.

As an alternative to having the resistive layers on opposite faces of a printed circuit assembly, as in FIGS. XII and XIII, they can all be placed on one face, although this will call for a somewhat larger surface area for such a face. Also resistor 191 can be connected externally and need not be included in the printed circuit assembly.

FIGURE XIV shows a modified printed circuit assembly in which a dielectric base 300 carries a resistance layer 361 that consists of three parts 399, 395, and 397. Each part corresponds to a resistor in the three distributed networks (FIG. XI) 199, 195, and 197, respectively. The construction of the plate is similar to FIG. VIII in so far as there are three terminal areas 311, 312, and 313 that through leads 341, 343, and 344 connect to the transistor base, the ground terminal, and the collector supply, respectively. On the opposite side of the dielectric substrate there is a conductive electrode 366 that provides distributed capacitance to all three resistance sections. Lead 342 is used to connect electrode 366 to the emitter terminal. There is no need in this type of construction for a conductive area equivalent to lead 193 since the connections between the three respective sections is made by their relative location. An oscillator containing this plate can be trimmed to its final frequency by increasing the length of the divider notch 385 between the sections 395 and 397 until the proper operation is obtained.

In the circuits illustrated above, the transistors can be of any kind. For instance, PNP types are illustrated, but NPN types will also operate.

Obviously, many modifications and variations of the present invention are possible in the light of the above teachings. It is, therefore, to be understood that within the scope of the appended claims the invention may be practiced otherwise than as specifically described.

What is claimed is:

1. A band-pass amplifier having two amplification stages with inputs and outputs and connected in cascade, one of said stages being a voltage follower stage with a normal maximum voltage gain less than 1, said one stage having connected between its output and input a passive RC phase shift positive feedback loop that provides within a frequency band sufficient feedback to bring the loop gain above one so that said one stage becomes a negative impedance within said frequency band, and a stabilizing negative feedback loop from an output of the second stage of the cascade to an input of the first stage of the cascade.

2. A band-pass amplifier as defined by claim 1 which is free of inductors, in which the stages are transistor stages and said one stage is the second stage in the cascade, the first stage in the cascade is a common emitter stage, the negative feedback is essentially from the collector of the voltage follower stage to the emitter of the common emitter stage, and said RC positive feedback loop is a distributed network.

3. A band-pass amplifier as defined by claim 1 in which the stages are transistor stages, the passive RC phase shift positive feedback network is connected from the emitter of the voltage follower stage to the base of that stage and has two branches one providing a distributed capacitance with a first resistor and the second a distributed capacitance with a second resistor, and the two resistors are series-connected for D.C. to provide by voltage-divider action a D.C. operating point for said transistor base.

4. A transistor type band-pass amplifier having at least two transistor amplification stages each with input and output terminals, a frequency selective positive feedback RC loop connected from output to input terminals of one stage, and a negative feedback loop connected from an output terminal of one of the two stages to an input terminal of the other stage, the RC components of the positive feedback loop being distributed printed components that selectively feed back signals in a limited frequency range to provide the desired band-pass characteristics, and said one stage is connected as a load to the output of said other stage.

5. A band-pass amplifier as defined in claim 4 wherein said positive feedback loop includes a high Q resonating element to control the center frequency of the pass band.

6. A band-pass amplifier as defined in claim 4 wherein there is a variable impedance across the negative feedback supply terminals, whereby the center frequency of the pass band is adjusted.

7. A transistor type band-pass amplifier having at least two transistor amplification stages, a frequency selective positive feedback RC loop connected from output to input terminals of one stage, a negative feedback loop connected from an output terminal of one of the two stages to an input terminal of the other stage, the RC components of the positive feedback loop being such that this loop selectively feeds back signals in a limited frequency range to provide the desired band-pass characteristics, the two stages being directly D.C. coupled in cascade and negative D.C. feedback from an output terminal of the second of the two cascaded stages to an input terminal of the first of the two cascaded stages to stabilize the D.C. operating points.

8. A band-pass amplifier as defined in claim 7 wherein the distributed capacitance of said RC network is connected to a source of adjustable D.C. voltage to adjust the center frequency of the pass band.

9. A transistor type band-pass amplifier having at least two transistor amplification stages each with input and output terminals, a frequency selective positive feedback RC loop connected from output to input terminals of one stage, and a negative feedback loop connected from an output terminal of one of the two stages to an input terminal of the other stage, the RC components of the positive feedback loop being distributed printed components that selectively feed back signals in a limited frequency range to provide the desired band-pass characteristics, and the positive feedback loop has two similar branches each with a distributed printed RC network, the resistances of the branches being connected as a voltage divider across a voltage supply to fix the operating point of a terminal of the transistor in said one stage, the capacitances of the positive feedback loop being connected from an output of said one stage to the respective branch resistances.

10. A band-pass amplifier having two transistor transfer stages connected in cascade, power supply leads connected to both stages for operating them from a D.C. voltage source, one of said stages being a voltage amplification stage, the other of said stages being an emitter-follower stage having a resistance connected between its base and one of the power supply leads, said resistance being in distributed capacitance relation to the emitter of the emitter-follower stage, and a negative feedback loop from the collector of said emitter-follower stage to the emitter of the other stage.

(References on following page)

References Cited by the Examiner

UNITED STATES PATENTS

| | | | |
|---|---|---|---|
| 2,245,598 | 6/1941 | Llewellyn | 330—100 |
| 2,331,708 | 10/1943 | Maynard | 330—104 |
| 2,629,025 | 2/1953 | Roberts | 330—109 X |
| 2,634,330 | 4/1953 | Gaudio | 333—79 |
| 2,637,777 | 5/1953 | Kilby et al. | 333—79 |
| 2,751,501 | 6/1956 | Eberhard | 331—108 |
| 2,816,228 | 12/1957 | Johnson | 331—108 |
| 2,924,781 | 2/1960 | Wilson et al. | 330—104 |
| 3,107,331 | 10/1963 | Barditch et al. | |
| 3,115,581 | 12/1963 | Kilby. | |
| 3,131,361 | 4/1964 | Brewer | 330—109 |
| 3,206,620 | 9/1965 | Freeman et al. | |

OTHER REFERENCES

Smith and Cooper: Printed Distributed R-C Networks. In Electrical Manufacturing, 58(5), pp. 121–125, November 1956.

Hager: Network Design of Microcircuits. In Electronics, 32(36), pp. 44–49, Sept. 4, 1959.

Herwald and Angello: Integration of Circuit Functions Into Solids. In Science, 132, pp. 1127–1133, Oct. 21, 1960.

ROY LAKE, *Primary Examiner.*

ARTHUR GAUSS, *Examiner.*

R. P. KANANEN, N. KAUFMAN, T. M. WEBSTER, *Assistant Examiners.*